United States Patent
Kyomasu et al.

(10) Patent No.: US 6,727,666 B2
(45) Date of Patent: Apr. 27, 2004

(54) XY TABLE FOR A SEMICONDUCTOR MANUFACTURING APPARATUS

(75) Inventors: Ryuichi Kyomasu, Kodaira (JP); Hiroto Urabayashi, Musashimurayama (JP); Minoru Torihata, Musashimurayama (JP); Kuniyuki Takahashi, Musashimurayama (JP); Toshimichi Miyahara, Tachikawa (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 70 days.

(21) Appl. No.: 10/133,535

(22) Filed: Apr. 26, 2002

(65) Prior Publication Data
US 2002/0180386 A1 Dec. 5, 2002

(30) Foreign Application Priority Data
Apr. 27, 2001 (JP) ........................................ 2001-131856

(51) Int. Cl.[7] ................................................. H02P 7/80
(52) U.S. Cl. ........................... 318/34; 318/38; 318/135; 318/687; 310/12
(58) Field of Search ............................. 318/34, 38, 135, 318/687; 310/12–13, 323, 328, 344

(56) References Cited

U.S. PATENT DOCUMENTS 4,667,139 A * 5/1987 Hirai et al. ................. 318/687
5,786,654 A * 7/1998 Yoshida et al. ............. 310/328

FOREIGN PATENT DOCUMENTS

JP        2000-003920        1/2000

* cited by examiner

Primary Examiner—Marlon T. Fletcher
(74) Attorney, Agent, or Firm—Koda & Androlia

(57) ABSTRACT

An XY table used in a semiconductor manufacturing apparatus including lower (X table) fixed to an X movable element and an upper table (Y table) fixed to a Y movable element, in which the upper table (Y table) is supported movably in a Y direction and immovably in an X direction on the lower table (X table), the X movable element is immovable in the Y direction with respect to the X motor main body, the Y movable element is movable in the X direction with respect to the Y motor main body. Furthermore, the Y motor main body is provided with a permanent magnet that covers an entire region of movement of a magnetic action component (coils) of the Y movable element in the X direction.

3 Claims, 5 Drawing Sheets

XY TABLE FOR A SEMICONDUCTOR MANUFACTURING APPARATUS

BACKGROUND OF THE INVENTION

1. Field of the Invention

The present invention relates to an XY table for a semiconductor manufacturing apparatus and more particularly to a structure for such an XY table that is controlled with high precision.

2. Prior Art

In a wire bonding apparatus and other semiconductor manufacturing apparatus, an XY table is employed so as to move the semiconductor device and other object to be processed in two directions (that is, in an X axis direction and a Y axis direction) that are perpendicular to each other on a horizontal plane.

As semiconductor elements have become increasingly integrated in recent years, the operating precision demanded to an XY table has reached the sub-micron level. As a result, various methods have been proposed for suppressing the vibration of the XY table and for positioning the table more precisely.

For instance, Japanese Patent No. 2,981,999 proposed by the present applicant discloses a method for canceling out reaction force in the operation of a reciprocating linear motor (hereinafter called "motor") that drives an XY table. In this structure, the motor main body is supported so that it can move in the opposite direction from the drive body; as a result, reaction force when a drive body is driven is canceled out.

Unfortunately, when a prototype was built in which this motor was installed in an XY table with a commonly used structure, control became unstable as resolution was increased, and the desired positioning precision could not be obtained.

This problem was further scrutinized, and it was revealed that the cause of the problem was not the vibration of the motor, but the structure of the conventional XY table to which the motor was applied.

More specifically, in the conventional XY table shown in FIG. 5, a lower table 60X directly coupled to an X movable element 58X of an X motor 51X that drives in the X axis direction is supported movably in the X axis direction and immovably in the Y axis direction on a table support block 62. In addition, an upper table 60Y is supported movably in the Y axis direction by a guide rail 61Y over the lower table 60X, and a Y movable element 58Y of a Y motor 51Y that drives in the Y axis direction is connected to this upper table 60Y via a guide 73 that is comprised of a roller 71 and a slider 72 and has freedom in the X axis direction. However, play in this guide 73 reduces the positioning precision.

Furthermore, in a configuration in which the upper table 60Y is offset from the Y movable element 58Y of the Y motor 51Y (that is, a configuration in which the Y—Y line (the center line of the weight distribution of the Y movable element 58Y) does not coincide with the center line TC of the weight distribution of the upper table 60Y), operation of the Y motor 51Y causes a thrust F in the yaw direction to act upon the upper table 60Y. As a result, wear and play in the sliding portion of the guide rail 61Y adversely affects positioning, causing control instability and a decrease in positioning precision.

SUMMARY OF THE INVENTION

Accordingly, the object of the present invention that is conceived on the basis of above-described new finding is to provide an XY table that has a higher positioning precision with an improved structure.

The above object is accomplished by a unique structure of the present invention for an XY table for a semiconductor manufacturing apparatus, in which a first drive unit (X motor) for driving a first drive body (X movable element) in a first direction (X direction) by means of a first motor main body (X motor main body) and a second drive unit (Y motor) for driving a second drive body (Y movable element) in a second direction (Y direction) by means of a second motor main body (Y motor main body) are disposed so that the first and second direction intersect at right angles, wherein the XY table is comprised of:

a lower table (X table) fixed to the first drive body (X movable element), and an upper table (Y table) fixed to the second drive body (Y movable element); and further the upper table (Y table) is supported movably in the second direction (Y direction) and immovably in the first direction (X direction) on the lower table (X table), the first drive body (X movable element) is immovable in the second direction (Y direction) with respect to the first motor main body (X motor main body), the second drive body (Y movable element) is movable in the first direction (X direction) with respect to the second motor main body (Y motor main body), and the second motor main body (Y motor main body) is provided with a magnetic field forming means (permanent magnet)) that covers an entire region of movement of a magnetic action component of the second drive body (Y movable element) in the first direction (X direction).

In this structure, the lower table (X table) and upper table (Y table) are fixed to the first drive body (X movable element) and second drive body (Y movable element), respectively. Accordingly, it is possible to prevent precision decrease that is seen in the conventional XY table caused by play in the guide member (the guide 73). Also, the first drive body (X movable element) is provided so as to be immovable in the second direction (Y direction) with respect to the first motor main body (X motor main body). Accordingly, even when the upper table (Y table) or what it carries is very heavy, any misalignment of the lower table (X table) in the second direction (Y direction) that would otherwise be caused by friction between the two tables can be prevented. Furthermore, the magnetic action of the second motor main body (Y motor main body) on the second drive body (Y movable element) remains constant regardless of the position of the second drive body (Y movable element) in the first direction (X direction). Thus, the upper table (Y table) is subjected to no thrust in the yaw direction, and therefore an increase in wear or play of the guide member (guide rail 61Y) for guiding the upper table (Y table) in its movement direction can be suppressed, misalignment and rotational vibration are less likely to occur, and high-precision and stable positioning can be performed.

In the present invention, the above XY table can further include a position sensor that is disposed on an symmetry axis of thrust in a second movable component that is comprised of the second drive body (Y movable element) and the upper table (Y table).

In this structure, the effect that misalignment of the second drive body (Y movable element) in the yaw direction has on the detection value of the position sensor can be minimized, affording greater detection precision.

The above-described position sensor can be disposed on the symmetry axis of thrust in a first movable component that is comprised of the first drive body (X movable element) and the lower table (X table).

Accordingly, the effect that misalignment of the first drive body (X movable element) in the yaw direction has on the detection value of the position sensor can be minimized.

Furthermore, in the XY table of the present invention, a reaction force produced by driving the first drive body (X movable element) and second drive body (Y movable element) is set so as to be canceled out by way of:

providing the first motor main body (X motor main body) to be movable in an opposite direction from the first drive body (X movable element) when the first drive body (X movable element) is driven, and providing the second motor main body (Y motor main body) so as to be movable in an opposite direction from the second drive body (Y movable element) when the second drive body (Y movable element) is driven.

With this structure, vibrations can be minimized, and an even higher detection precision is obtained.

DETAILED DESCRIPTION OF THE INVENTION

One embodiment of the present invention will be described below with reference to FIGS. 1 to 4.

Figure 1:
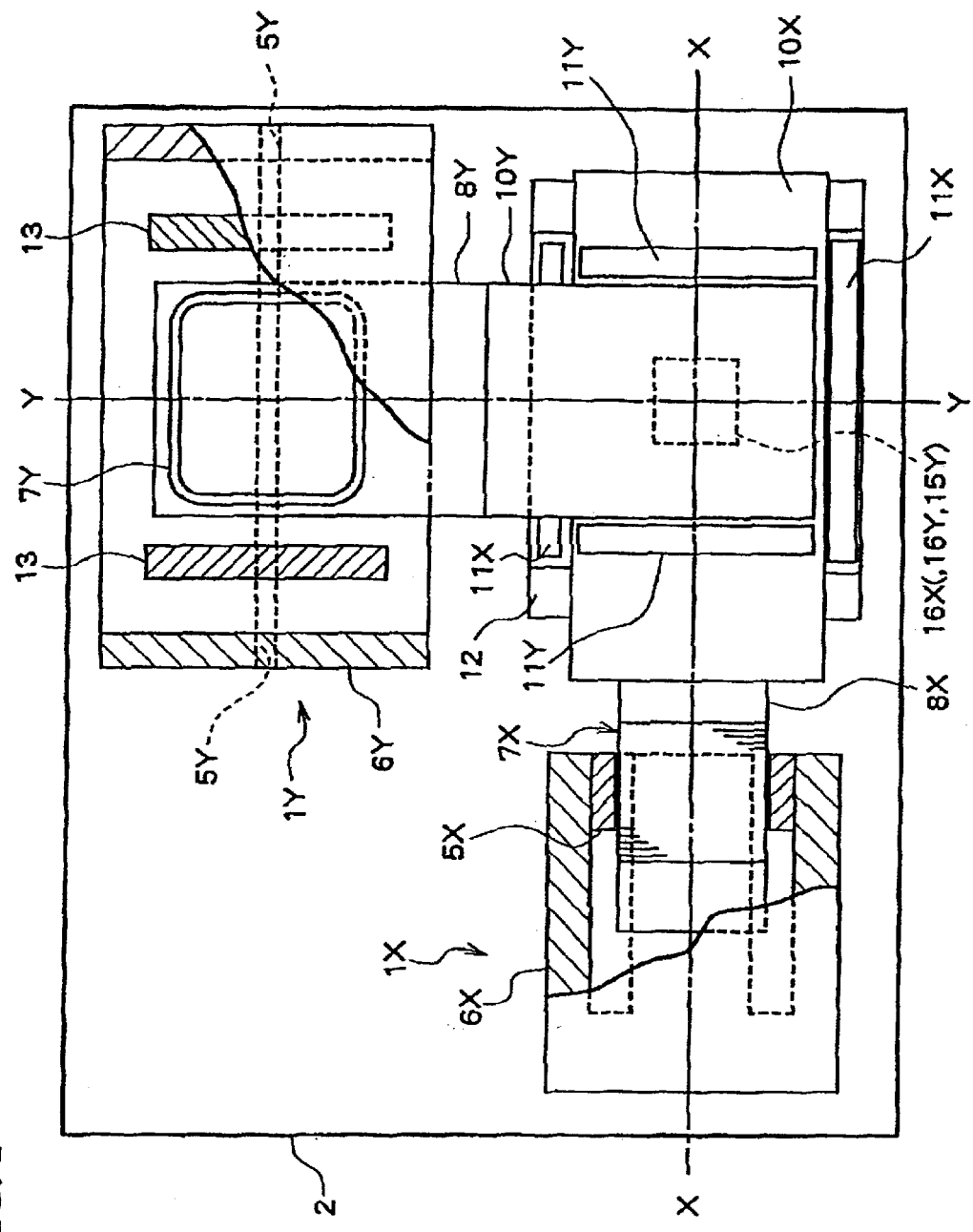
FIG. 1 is a top view of the XY table according to one embodiment of the present invention.

As seen from FIG. 1, an XY table is comprised of an X motor 1X, which is a first drive device, and a Y motor 1Y, which is a second drive device and a planar linear motor. The X motor 1X and the Y motor 1Y are respectively disposed along the X axis (X—X line direction) and the Y axis (Y—Y line direction), which are coordinate axes that are mutually perpendicular on a horizontal plane. In the following description, elements that correspond to each other in functions on the X motor 1X side and the Y motor 1Y side are referred to by the same reference numerals with an X or Y appended to the reference numerals so as to indicate the X axis or Y axis.

Figure 2:
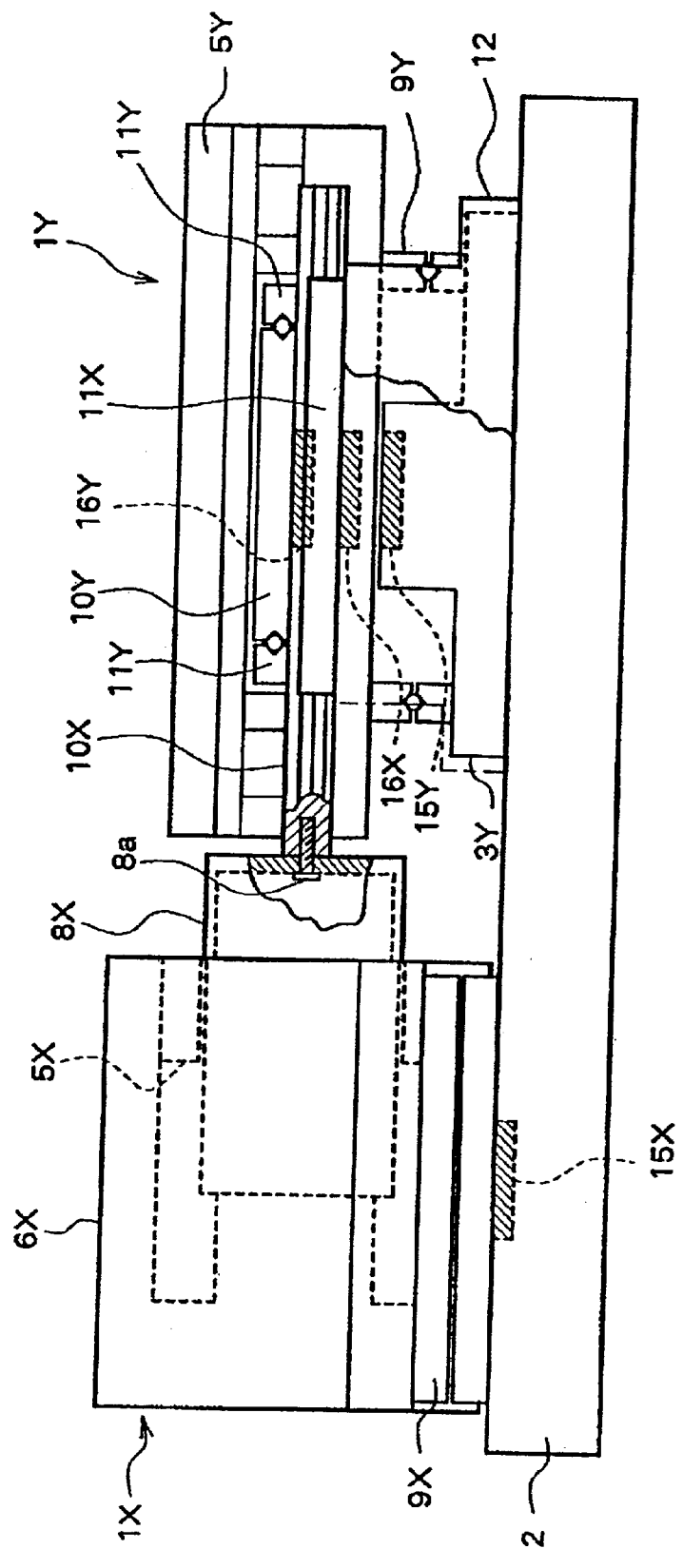
FIG. 2 is a front view thereof.
Figure 3:
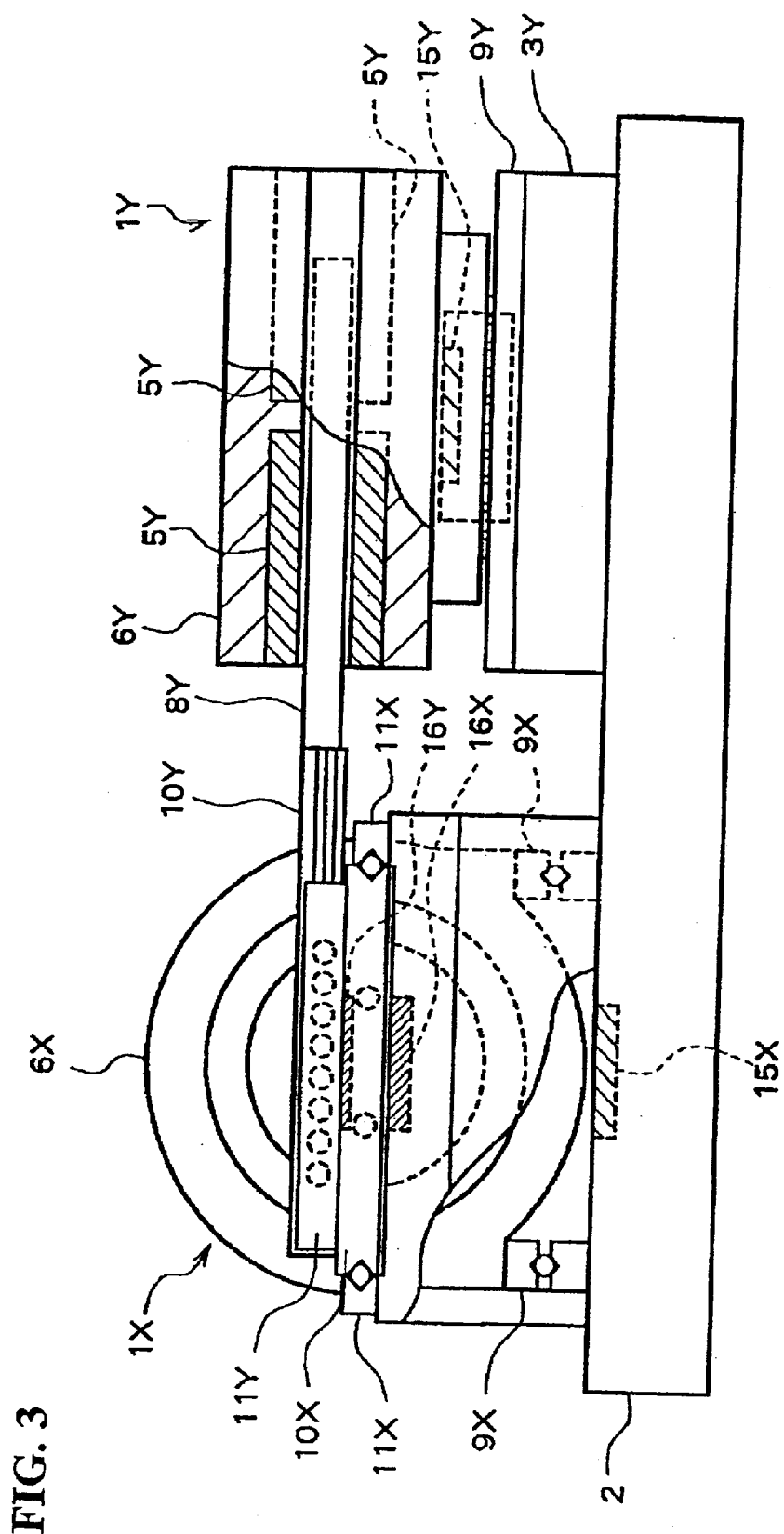
FIG. 3 is a side view thereof.

The X motor 1X is installed on the top surface of a frame 2 via a guide rail 9X (see FIGS. 2 and 3). The X motor 1X is a voice coil motor, and it has a conventional structure that comprises an X motor main body 6X and an X movable element 8X. The X motor main body 6X includes permanent magnets 5X; and the X movable element 8X, which serves as the first drive body, includes a coil 7X. The X movable element 8X is supported inside the X motor main body 6X by a guide rail 11X, which allows the X movable element 8X to move only in the X axis direction. The guide rail 9X is a known direct drive type that uses ball bearings, etc. The X motor main body 6X is supported by the guide rail 9X so as to be movable in the X axis direction, which is the drive axis direction of the X movable element 8X, and to be immovable in the Y axis direction.

A lower table 10X is fixed by a bolt 8a (see FIG. 2) to the front end of the X movable element 8X. The lower table 10X is supported on a table support block 12 via the guide rail 11X such that the lower table 10X is movable in the X axis direction, which is the drive axis direction of the X movable element 8X, and immovable in the Y axis direction. The table support block 12 is fixed to the frame 2. The weight of the X motor main body 6X is greater than the combined weight of the X movable element 8X and the lower table 10X.

An X motor main body speed sensor 15X for sensing the movement speed of the X motor main body 6X in the X axis direction is attached to the frame 2. A lower table sensor 16X for sensing the movement speed and position of the lower table 10X in the X axis direction is attached to the top surface of the table support block 12.

The Y motor 1Y is installed on the top surface of the frame 2 via a Y motor support block 3Y and a guide rail 9Y (see FIGS. 2 and 3). The Y motor 1Y is a planar linear motor, and it has a known structure that comprises a Y motor main body 6Y and a Y movable element 8Y. The Y motor main body 6Y includes permanent magnets 5Y; and the Y movable element 8Y, which serves as the second drive body, includes a coil 7Y (see FIG. 1). The Y movable element 8Y is supported inside the Y motor main body 6Y by a known support means (not shown, and it is, for instance, an air bearing or a steel ball roller) that has a freedom in the XY directions. The Y motor main body 6Y is supported by the guide rail 9Y so as to be movable in the Y axis direction, which is the drive axis direction of the Y movable element 8Y.

A stopper 13 is provided a specific distance away from the Y movable element 8Y and parallel to the Y movable element 8Y. The permanent magnets 5Y, which are the magnetic field forming means in the Y motor main body 6Y, are provided all the way to the end of the Y motor main body 6Y, which is on the outside in the X axis direction with respect to the position of the stopper 13. As a result, the permanent magnets 5Y evenly cover the entire region of movement of the coil 7Y in the X axis direction, the coil 7Y being the magnetic action component of the Y movable element 8Y. In other words, this coverage by the magnets 5Y is such that the magnetic action on the coil 7Y is equal over the entire region of movement of the coil 7Y in the X axis direction.

An upper table 10Y is fixed to the Y movable element 8Y. The upper table 10Y is supported on the lower table 10X via a guide rail 11Y that extends in the Y axis direction. Thus, the upper table 10Y is supported by the lower table 10X so as to be movable in the Y axis direction, which is the drive axis direction of the Y movable element 8Y. The weight of the Y motor main body 6Y is greater than the combined weight of the Y movable element 8Y and the upper table 10Y.

A Y motor main body speed sensor 15Y for sensing the movement speed of the Y motor main body 6Y is attached to the Y motor support block 3Y. An upper table sensor 16Y for sensing the movement speed and position of the upper table 10Y in the Y axis direction is attached to the top surface of the lower table 10X.

With the structure above, when the X motor 1X is driven according to a command issued by a controller (described later, the X movable element 8X and the lower table 10X are moved in the X axis direction, thus causing the upper table 10Y to move in the X axis direction. At this point, the coil 7Y of the Y movable element 8Y fixed to the upper table 10Y is moved in the X axis direction between the upper and lower permanent magnets 5Y in the Y motor main body 6Y. However, since the permanent magnets 5Y cover the entire region of movement of the coil 7Y in the X axis direction as described above, the flux of the permanent magnets 5Y interlinked at the coil 7Y remains constant regardless of the position of the Y movable element 8Y in the X axis direction.

When, on the other hand, the Y motor 1Y is driven according to a command issued by the controller (described later), the Y movable element 8Y and the upper table 10Y are moved in the Y axis direction. However, because the movement of the X movable element 8X and the lower table 10X in the Y axis direction is restricted at this point by the guide rail 11X, they are not moved in the Y axis direction.

Figure 4:
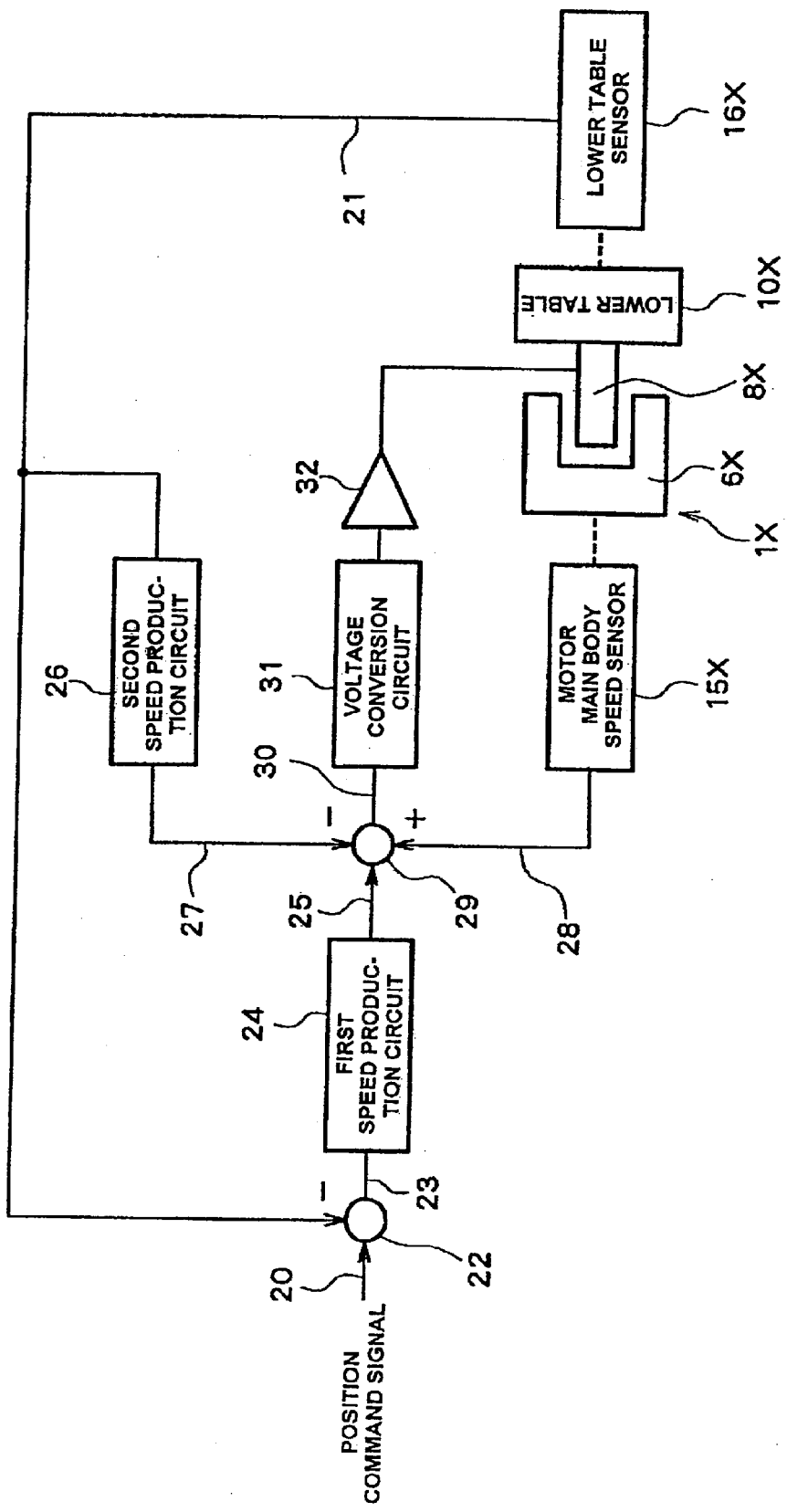
FIG. 4 is a block diagram for executing the control of the XY table of the shown embodiment.

FIG. 4 is a block diagram of the control of the XY table shown in FIGS. 1 to 3, illustrating the portion pertaining to the control of the X motor 1X. The structure of the portion pertaining to the control of the Y motor 1Y is the same as that of the portion pertaining to the control of the X motor 1X. A detail description of the structure and operation of the control of the Y motor 1Y will be thus omitted.

In FIG. 4, a position command signal 20 from the controller (not shown) and a drive body position signal 21 from the lower table sensor 16X are added or subtracted by a position addition circuit 22. A speed is produced by a first speed production circuit 24 on the basis of the added or subtracted position command signal 23 and is outputted as a speed command signal 25. Thus, the drive body position signal 21 from the lower table sensor 16X is fed back to the position command signal 20 from the controller.

The speed command signal 25, a drive body speed signal 27 produced by a second speed production circuit 26 on the basis of the drive body position signal 21, and a motor main body speed signal 28 produced by the motor main body speed sensor 15X are added or subtracted by a speed addition circuit 29. The added or subtracted speed command signal 30 is converted to voltage by a voltage conversion circuit 31 and supplied through an amplifier circuit 32 to the X motor 1X. The drive body speed signal 27 and the motor main body speed signal 28 are fed back to the speed command signal 25.

The operation of above-described embodiment will now be described below.

When the position command signal 20 for moving the lower table 10X to a specific position is outputted from the controller (not shown), the speed command signal 25 is produced by the position addition circuit 22 and the first speed production circuit 24. The thus produced speed command signal 25 is converted to voltage by the voltage conversion circuit 31, amplified by the amplifier circuit 32, and supplied to the coil 7X of the X motor 1X.

When voltage is supplied to the coil 7X, the X movable element 8X is accelerated in the X axis direction (its drive axis direction) according to the direction of the current produced by this voltage, and the lower table 10X is guided by the guide rail 11X and moves in the X axis direction. Meanwhile, because the X motor main body 6X is provided movable in the X axis direction along the guide rail 9X, the X motor main body 6X is subjected to an equal and opposite force as the reaction of the drive of the X movable element 8X and the lower table 10X. As a result, the X motor main body 6X is accelerated in the opposite direction from the movement of the lower table 10X.

In the above operation, the position of the lower table 10X is sensed by the lower table sensor 16X, inputted as a drive body position signal 21 in the position addition circuit 22 and then fed back to the position command signal 20. A drive body speed signal 27 is produced by the second speed production circuit 26 on the basis of the drive body position signal 21, inputted in the speed addition circuit 29 and then fed back to the speed command signal 25 of the first speed production circuit 24; and voltage is supplied to the coil 7X of the X motor 1X so that the lower table 10X is moved to the specified position.

Thus, since the X motor main body 6X is moved in the opposite direction from the drive axis direction of the lower table 10X, the momentum to which the frame 2 is subjected is theoretically zero, and the frame 2 does not shake. In actual operation, because of friction on the guide rail 9X, some force, which is extremely weak, is applied to the frame 2.

As described above, the X motor main body 6X is movable in the X axis direction. Accordingly, when the X movable element 8X and the lower table 10X are accelerated, the X motor main body 6X is accelerated in the opposite direction. The acceleration here is inversely proportional to the weight of the X motor main body 6X and the combined weight of the X movable element 8X and the lower table 10X. For example, if the combined weight of the X movable element 8X and the lower table 10X is 5 kg, and the weight of the X motor main body 6X is 25 kg, then when the lower table 10X is accelerated at one (1) G, the X motor main body 6X will be accelerated in the opposite direction from the lower table 10X at (5÷25)×1 G, or at 0.2 G.

As a result, the relative acceleration of the lower table 10X and the X motor main body 6X is 1.2 G; and as a result, both the relative speed between the X movable element 8X and the X motor main body 6X and the movement speed of the lower table 10X becomes 20% higher. More specifically, even though the relative speed of the X movable element 8X and the X motor main body 6X is 20% higher than the movement speed of the lower table 10X as sensed by the lower table sensor 16X, since the lower table sensor 16X only senses the movement speed of the lower table 10X, this 20% relative speed is ignored in applying voltage to the coil 7X. The coil 7X, though, generates electromotive force proportional to the relative speed, accordingly, the applied voltage produced on the basis of the signal sent from the lower table sensor 16X is 20% lower than the voltage (drive force) that is supposed to be applied to the coil 7X.

The X motor main body speed sensor 15X compensates for this lack of voltage supplied to the coil 7X. More specifically, the speed of the X motor main body 6X is sensed by the motor main body speed signal 28; the motor main body speed signal 28 is inputted in the speed addition circuit 29 and added to the speed command signal 25 and the drive body speed signal 27, thus becoming the speed command signal 30, which is inputted in the voltage conversion circuit 31 and then amplified by the amplifier circuit 32; and voltage is supplied to the coil 7X. The lack of voltage supplied to the coil 7X is thus compensated.

Meanwhile, the X motor main body 6X is provided so as to be movable in the X axis direction. Accordingly, even if the X motor main body 6X is shaken while the lower table 10X is stopped (without any relation to the lower table 10X), such as when the X motor main body 6X is moved by hand, since the lower table sensor 16X senses the specific position of the lower table 10X, the circuit will attempt to output a stop signal, that is, 0 (zero) V. If no X motor main body speed sensor 15X is provided, the lower table 10X will attempt to stop relative to the X motor main body 6X, that is, to move in conjunction with the movement of the X motor main body 6X. As a result, the lower table 10X will be out of position and attempt to return to its home position. This results in a discrepancy between the speed command and the position command; and the lower table 10X will make a move in between these (speed and position) commands, that is, its movement will resemble the movement of the X motor main body 6X while being less than the amount that the X motor main body 6X is moved by hand. The extent of this is determined by the gain of speed feedback and position feedback.

In other words, even when the X motor main body 6X is moved by an external force, the control circuit works so that the voltage applied to the coil 7X is such that the signal added to the circuit from the motor main body speed sensor 15X is proportional to the movement of the X motor main body 6X. As a result, the voltage generated by the relative speed between the X motor main body 6X and the lower table 10X is applied in the opposite direction to the coil 7X by the motor main body speed signal 28 from the motor main body speed sensor 15X. Therefore, the coil 7X generates no current, and no force is generated; and thus, the lower table 10X is not affected by the movement of the X motor main body 6X. The same operation occurs with the Y motor 1Y, and the details thereof are the same as for the X motor 1X and thus not described here.

Figure 5:
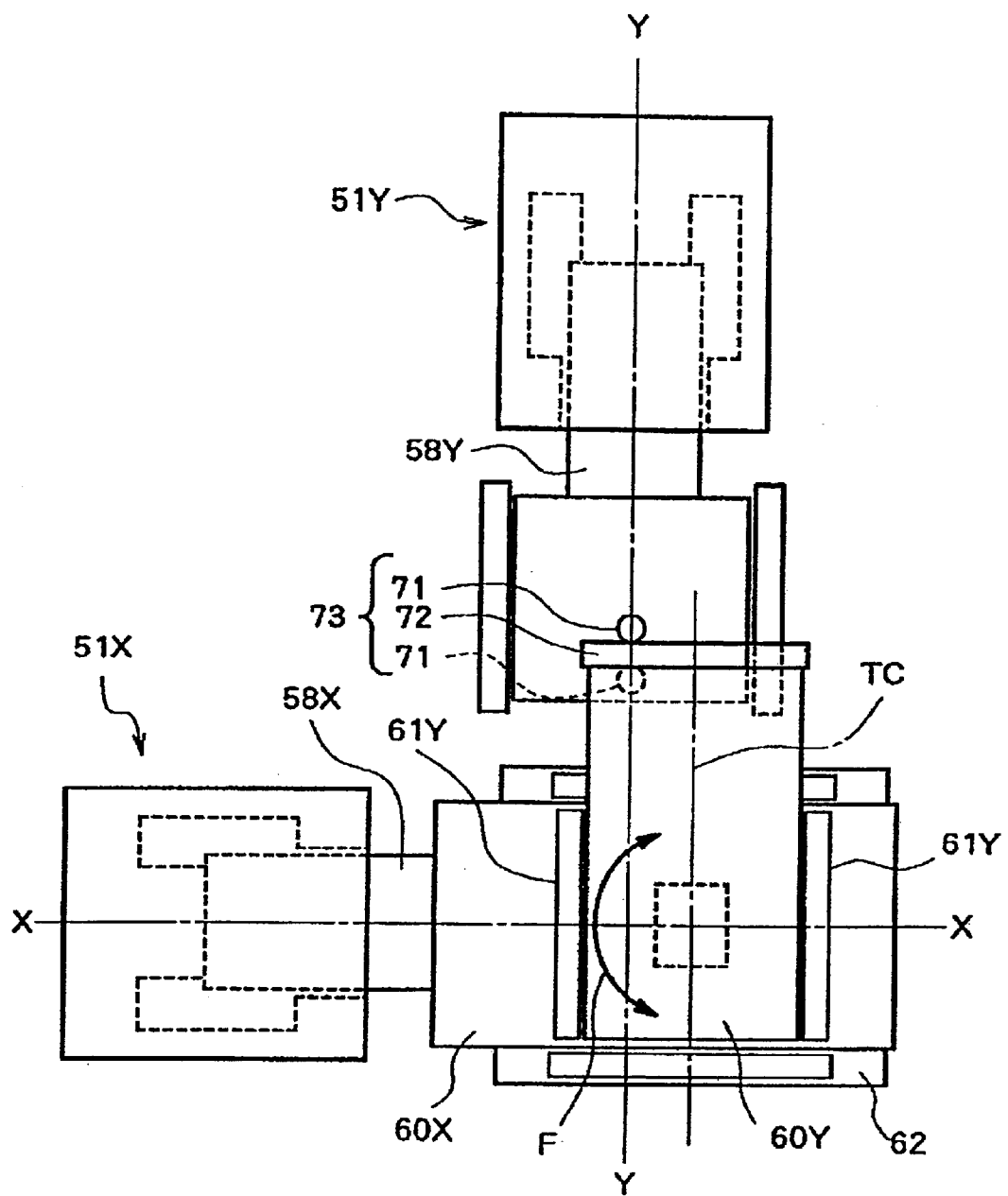
FIG. 5 is a top view of a prior art XY table.

As described in detail in the above, in the above embodiment, the lower table 10X is fixed to the X movable element 8X, and the upper table 10Y is fixed to the Y movable element 8Y. Accordingly, there is no danger of precision decrease that occurred by play in a conventional guide member (the guide 73 in FIG. 5). Also, the X movable element 8X is immovable in the Y axis direction with respect to the X motor main body 6X. Thus, even when the upper table 10Y or what it carries is very heavy, any misalignment of the lower table 10X in the Y axis direction caused by friction between the tables 10X and 10Y can be prevented. Since the magnetic action of the Y motor main body 6Y on the Y movable element 8Y remains constant regardless of the position of the Y movable element 8Y in the X axis direction, the upper table 10Y is subjected to no thrust in the yaw direction. Therefore, an increase in wear or play of the guide rail 11Y is suppressed, misalignment and rotational vibration are less likely to occur, and high-precision and stable positioning the XY table can be performed.

The magnetic field of the permanent magnets 5Y in the present invention is preferably contiguous over the entire movement region of the Y movable element 8Y in the X axis direction. It also can be disposed so as to vary periodically in the X axis direction even if it is broken up into patches. When the magnetic field of the permanent magnets 5Y is in a patch-like pattern, then the length of the coil 7Y of the Y movable element 8Y in the X axis direction should be longer than one period, and the center line of thrust of the Y motor 1Y acting on the upper table 10Y should be designed so as to always coincide with the center line (the Y—Y line in the drawings) of the weight distribution of the upper table 10Y and the Y movable element 8Y put together.

In the above embodiment, the upper table sensor 16Y for sensing the position of the Y movable element 8Y in the Y axis direction is disposed on the symmetry axis of thrust in a second movable component consisting of the Y movable element 8Y and the upper table 10Y. Accordingly, the effect that misalignment of the upper table 10Y in the yaw direction has on the detection value of the upper table sensor 16Y can be minimized, thus affording greater detection precision.

Furthermore, in the shown embodiment, the upper table sensor 16Y is disposed on the symmetry axis of thrust in a first movable component that is comprised of the X movable element 8X and the lower table 10X. Accordingly, the effect that misalignment of the X motor 1X in the yaw direction has on the detection value of the upper table sensor 16Y can be also minimized.

In addition, in the shown embodiment, when the X motor 1X is driven, the X motor main body 6X is able to move in the opposite direction from the X movable element 8X; and when the Y motor 1Y is driven, the Y motor main body 6Y is able to move in the opposite direction from the Y movable element 8Y; and thus, the reaction force produced by the driving of the X motor 1X and Y motor 1Y is canceled out. Accordingly, vibration is suppressed, and even better detection precision can be provided.

The above embodiment is described with reference to the use of a voice coil motor for the X motor 1X. However, a pulse motor, a DC motor, an AC motor or the like can be used instead of the X motor 1X.

The XY table of the present invention can be used not only in various bonding apparatuses but also in a wide range of semiconductor manufacturing apparatuses that require high positioning precision in the X and Y axis directions. For a wire bonding apparatus, the bonding head that performs the bonding is mounted on the top surface of the upper table 10Y.

What is claimed is:

1. An XY table for a semiconductor manufacturing apparatus, in which a first linear drive unit for driving a first drive body in a first direction by means of a first motor main body and a second drive unit for driving a second linear drive body in a second direction by means of a second motor main body are disposed so that said first linear direction and said second linear direction intersect at right angles in a horizontal plane, wherein said XY table comprises:

a lower table fixed to said first chive body, and an upper table fixed to aid second drive body, wherein said upper table is supported movably in said second linear direction and immovably in said first linear direction on said lower table, said first drive body is immovable in said second linear direction with respect to said first motor main body, said second drive body is movable in said first linear direction with respect to said second motor main body, and said second motor main body is provided with a magnetic field fanning means that covers an entire region of movement of a magnetic action component of said second drive body in maid first linear direction; and wherein when said first drive body is driven, said first motor main body is movable in an opposite linear direction from said first drive body; and when said second drive body is driven, said second motor main body is movable in an opposite linear direction from said second drive body, so that a reaction force produced by driving said first drive body and second drive body is canceled out.

2. The XY table for a semiconductor manufacturing apparatus according to claim 1, further comprising a position sensor that is disposed on an symmetry axis of thrust in a second movable component that is comprised of said second drive body and said upper table.

3. The XY table for a semiconductor manufacturing apparatus according to claim 2, wherein said position sensor is disposed on said symmetry axis of thrust in a first movable component that is comprised of said first drive body and said lower table.

* * * * *